US012693810B2

(12) United States Patent
Uzzan

(10) Patent No.: US 12,693,810 B2
(45) Date of Patent: Jul. 28, 2026

(54) AUTOMATED DATA ERASURE DEVICE AND METHOD

(71) Applicant: Lionel Uzzan, Paris (FR)

(72) Inventor: Lionel Uzzan, Paris (FR)

( * ) Notice: Subject to any disclaimer, the term of this patent is extended or adjusted under 35 U.S.C. 154(b) by 156 days.

(21) Appl. No.: 18/311,643

(22) Filed: May 3, 2023

(65) Prior Publication Data

US 2024/0211164 A1      Jun. 27, 2024

(30) Foreign Application Priority Data

Dec. 27, 2022    (EP) ..................................... 22216839

(51) Int. Cl.
*G06F 3/06*         (2006.01)
*G11C 16/16*       (2006.01)
*G11C 16/18*       (2006.01)

(52) U.S. Cl.
CPC ............ *G06F 3/0679* (2013.01); *G11C 16/16* (2013.01); *G11C 16/18* (2013.01)

(58) Field of Classification Search
CPC ....... G06F 3/0679; G11C 16/16; G11C 16/18; H05G 1/32; H01L 2924/20202; H01J 2237/0047
See application file for complete search history.

(56) References Cited

U.S. PATENT DOCUMENTS

| | | | | |
|---|---|---|---|---|
| 3,900,959 | A | * | 8/1975 | Breschi .................... F26B 13/10 |
| | | | | 34/639 |
| 5,136,569 | A | * | 8/1992 | Fennema ............... G11B 7/126 |
| | | | | 369/53.23 |
| 5,452,720 | A | * | 9/1995 | Smith ...................... H05G 1/34 |
| | | | | 600/427 |
| 2018/0007769 | A1 | * | 1/2018 | Helm ...................... H05G 1/10 |

FOREIGN PATENT DOCUMENTS

| | | | | | |
|---|---|---|---|---|---|
| EP | 0212520 | A2 | * | 3/1987 | ........... G01R 31/308 |
| WO | WO2015007847 | A1 | * | 1/2015 | ......... G11C 11/5635 |

OTHER PUBLICATIONS

Campos, Arlene, Anode (x-ray tube), Jan. 17, 2010, Radiopaedia. org (Year: 2010).*

* cited by examiner

*Primary Examiner* — Khamdan N. Alrobaie
*Assistant Examiner* — Elizabeth Rose Agger
(74) *Attorney, Agent, or Firm* — HAUPTMAN HAM, LLP

(57)                ABSTRACT
An automated device and method for erasing data stored in non-volatile memories (M) of electronic devices (A), such as smartphones or tablets. The device uses an irradiation chamber (1) comprising at least one X-ray source (S) confined in a X-ray-tight enclosure, capable of receiving a plurality of electronic devices (A) that can be brought into the chamber (1) by a conveyor (2). A control unit (CU) controls the conveyor (2) and the X-ray source (S) to irradiate each electronic device (A) with controlled power and duration for erasing data stored in the non-volatile memories (M) of said electronic devices (A).

18 Claims, 2 Drawing Sheets

AUTOMATED DATA ERASURE DEVICE AND METHOD

PRIORITY CLAIM AND CROSS-REFERENCE

The present application claims priority to European Application Number EP22216839.5, filed on Dec. 27, 2022, the entirety of which is hereby incorporated herein.

BACKGROUND

One or more embodiments of the present invention relate to the field of electronic devices containing non-volatile memories (NAND or NOR), for example such as smart-phones, tablets, or any type of device containing such memories. The invention particularly concerns the erasure of data contained in such memories.

Indeed, a problem in this field concerns the erasure of data contained in these memories, especially in the case of refurbishing or recycling these devices, to ensure that users' data cannot be retrieved by third parties without their consent. Conventionally, to erase data in this type of memory, the bits are reset by accessing the memory through computer means using logic gates, which is tedious and requires to start the device which needs to be at least partially functional. For example, when a device is no longer functional to the point that the motherboard and/or main components must be repaired to launch a software erasure command, the preferred solution for now is to relegate the device for destruction by grinding and/or melting, which represents obvious waste in many ways (with significant economic and ecological issues). Furthermore, when these devices remain sufficiently functional for software access, a recurring problem concerns the fact that the many devices on the market have very different connection means and operating systems, which requires a wide variety of connec-tors and data access software. The time required for data erasure is therefore significant and problematic. Automating data erasure is therefore difficult to envisage in the current state of the prior art. On the other hand, the types of memories contained in these devices have various hardware architectures, more or less performant and resistant, which also complicates data erasure.

In this context, the present application proposes a device allowing reliable and rapid data erasure, avoiding the unnec-essary destruction of devices as much as possible and preferably in a way compatible with the automation of electronic device data erasure.

This objective is achieved by an automated device for erasing data stored in non-volatile memories of electronic devices, for example, portable devices such as smartphones or tablets, characterized in that it comprises an irradiation chamber comprising at least one X-ray source confined in an enclosure hermetic to X-rays and capable of successively receiving a plurality of electronic devices that can be brought into the chamber by a conveyor, a control unit controlling the conveyor and said X-ray source to irradiate each of the electronic devices with controlled power and duration for erasing data contained in the non-volatile memories of said electronic devices.

According to another feature, the control unit controls the X-ray source by controlling the power and duration based on the type of memory contained in said electronic devices.

According to another feature, the control unit controls the irradiation power by controlling a supply voltage of the X-ray source between 175 and 300 kilovolts and a target intensity of the X-ray source between 250 and 900 micro-amperes, preferably 350 to 750 microamperes.

According to another feature, the control unit controls the X-ray source to deliver irradiation for a duration between 1 and 8 minutes, preferably 2 to 5 minutes.

According to another feature, the X-ray source has a target made of Tungsten or Molybdenum.

According to another feature, the X-ray source has a window made of Beryllium or Aluminum.

According to another feature, the distance between said source and the conveyor transporting the devices is between 2 and 5 centimeters, preferably 2.5 to 4 centimeters.

According to another feature, the source generates an X-ray beam irradiating said devices along a main axis that is inclined or tiltable with respect to the plane of the conveyor.

Another object of the present application is to provide a reliable and fast data erasure method, avoiding unnecessary destruction of devices as much as possible and preferably compatible with the automation of electronic devices data erasure.

This object is achieved by a method of erasing data stored in non-volatile memories of electronic devices, for example portable devices, such as smartphones or tablets, character-ized in that it comprises irradiating said electronic devices with at least one X-ray source confined in an X-ray-tight enclosure of an irradiation chamber capable of successively receiving a plurality of electronic devices that can be brought into the chamber by a conveyor, the conveyor and said X-ray source being controlled by a control unit con-trolling the power and duration of irradiation for erasing the data contained in the non-volatile memory of said electronic devices.

BRIEF DESCRIPTION OF THE DRAWINGS

Other features and advantages of the present invention will become more apparent from reading the description of various embodiments below, made with reference to the appended drawings, in which.

DETAILED DESCRIPTION

Figure 1:
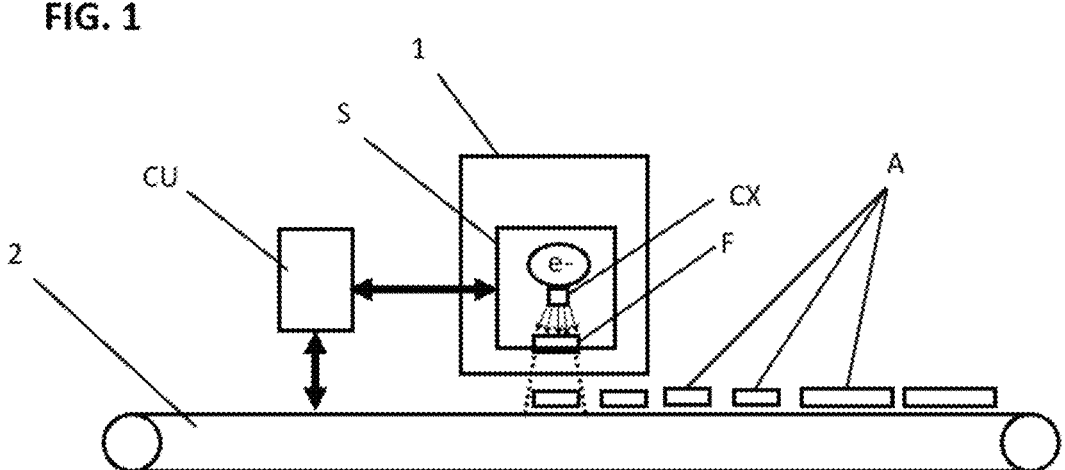
FIG. 1 depicts a schematic view of the automated data erasure device according to various embodiments.

One or more embodiments of the present invention relate to an automated device for erasing data stored in non-volatile memories (M) of electronic devices (A), such as portable devices like smartphones or tablets or any type of electronic device or data storage device containing non-volatile memories, such as "Flash" type memories. The term "non-volatile memories" encompasses, for example, NAND or NOR type memories (i.e., flash and/or EEPROM) based on semiconductor technology (MOS, "metal-oxide semicon-ductors") using floating-gate transistors that trap one or more electrons (technologies known under the acronyms SLC, MLC or TLC) in charge traps (or cells), configured in the form of floating grids arranged in one or more layers (3D NAND technology), each electron corresponding to a bit of data that can be recorded and erased at will. Conventionally, to erase data in this type of memory, bits are reset by accessing the memory through computer means using logic gates, whereas the present application proposes to erase data more quickly without requiring computer access to this type of memory, thanks to the use of X-rays calibrated to expel the trapped electrons in the charge traps. To this end, the present invention proposes a calibration of the irradiation that takes into account the architecture of non-volatile memories. The invention allows, for example, for the rapid erasure of personal data stored in memories of electronic devices, such as portable devices like smartphones or tablets or any other device integrating this type of memory (e.g., portable memories). The erasure of data is particularly important with regard to preserving the confidentiality of users' personal data (e.g., in the context of the GDPR), especially when users' devices or appliances are intended to be reconditioned or recycled. Data erasure is generally tedious, whereas the present invention allows for easy and rapid data erasure, providing advantages in terms of time and cost, regardless of the fate of the device whose data stored in its non-volatile memory needs to be erased. Moreover, for example, in the case of reconditioning, this data erasure should preferably avoid damaging other components of the device, and various embodiments of the invention enable to address this problem.

The automated data erasure device according to various preferred embodiments of the invention is characterized by a radiation chamber (1) (or "cabin") comprising at least one X-ray source (S) confined in an enclosure hermetic to X-rays (or "X-ray-tight enclosure") and capable of successively receiving a plurality of electronic devices (A) which can be brought into the chamber (1) by a conveyor (2). Such an X-ray impermeable chamber (1) is known in the field and necessary to protect users, particularly due to the irradiation powers used for the implementation of the present invention. The conveyor (2) can, for example, be a conveyor belt on which the devices (A) to be irradiated are arranged successively, for example after their identification, as detailed below. On the other hand, the device comprises a control unit (CU) controlling the conveyor (2) and said X-ray source (S) to irradiate each of the electronic devices (A) with controlled power and duration for erasing the data contained in the non-volatile memories (M) of said electronic devices (A). The chamber (1) therefore has a hermetically sealed X-ray enclosure (i.e., X-ray-tight enclosure) into which the devices (A) enter through the conveyor, through at least one door (for example, a single door if the conveyor makes round trips through a single entrance-exit of the chamber or two doors if the conveyor crosses the chamber, such doors can for example slide perpendicularly to the plane of the conveyor, for example vertically) preferably preventing any escape of radiation from the chamber (1). These doors are controlled by the control unit (CU) when the devices (A) are moved in front of the X-ray source (S). The opening and closing of the doors will therefore be controlled according to the irradiation times of the devices (A) in the chamber (1), either individually device by device or by batches of several devices simultaneously. Regarding the irradiation and control of the source (S), the present applicant has observed that it is necessary to control both the power and the duration of irradiation of the various devices (A) due to the nature of the memories (M) and/or other components they contain, as detailed below.

Figure 2:
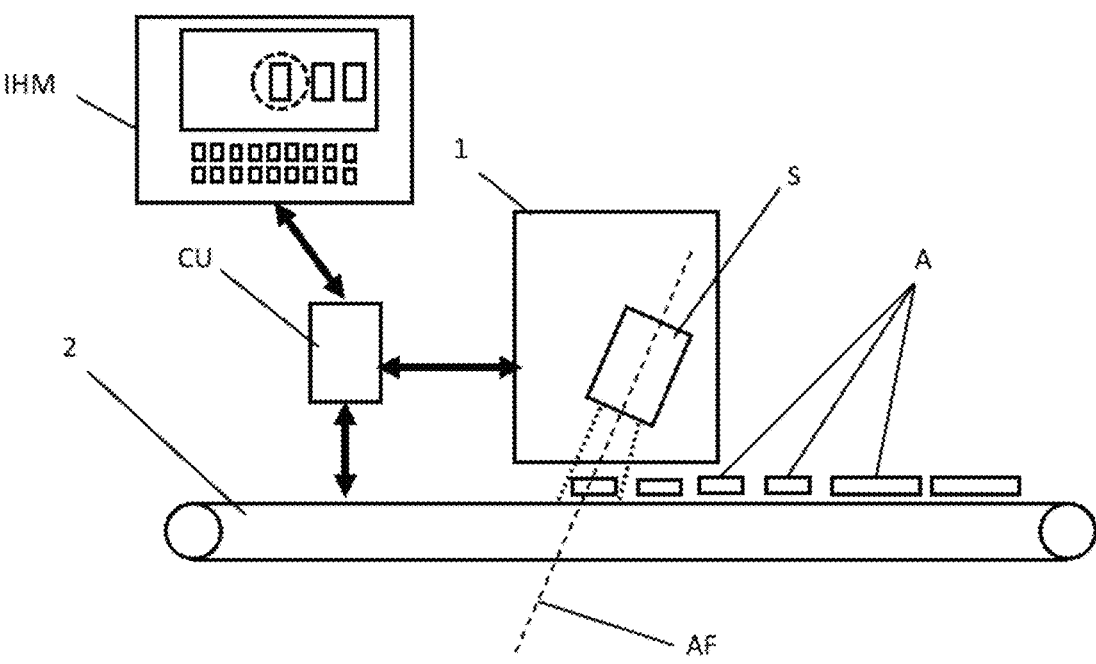
FIG. 2 depicts a schematic view of the automated data erasure device according to various embodiments, compris-ing an inclinable X-ray beam.

In various preferred embodiments of the invention, the control unit (CU) drives the X-ray source by controlling the power and duration based on the type of memory (M) contained in the electronic devices (A). Indeed, depending on the type of memory (M) and their architecture, the applicant of the present application has observed that the duration and power of irradiation must be adjusted to ensure data erasure. For example, "cheap" or "low-end" memories are often more sensitive than higher-quality memories. On the other hand, certain memories (M) are designed to be protected from radiation, especially when electronic devices (A) pass through airport scanners. Thus, these memories require more power and duration than unprotected ones. Moreover, the location of memories (M) in electronic devices (A) varies greatly, to the point that some memories (M) are protected, intentionally or accidentally, by the presence of other components in the devices (A). Finally, there are three-dimensional structured memories, such as those using the technology known as 3D NAND, in which data is stored in multiple overlapping layers, requiring more irradiation than single-layer memories. It follows from all these aspects that, depending on the model of electronic device (A) in which data erasure is desired, it is necessary to know the type of memory and its location to control irradiation and adjust the power and duration, which affects the speed of the conveyor (2) that brings successive devices (A) into the chamber (1). Therefore, it is necessary for the control unit (CU) to be able to control these parameters, thanks to knowledge of the type of devices (A) and/or memories (M) to be irradiated, for example, by means of serial numbers of the devices (A). This knowledge can be provided by a user entering the parameters used by the control unit or selecting the parameters to be used from a plurality of parameters stored in a memory of the control unit (CU). Preferably, the various devices (A) of the same type will be prepared in advance to be conveyed successively so that the parameters and speed are constant, but the invention provides for their variation depending on the type of devices (A) prepared on the conveyor. In certain embodiments, means for identifying electronic devices (A) will be provided for automatic recognition of devices (A) and adjustment of irradiation parameters by the control unit using a memory storing the corresponding parameters for the recognized devices (A). In certain embodiments, one illustrative and non-limiting example of which is shown in FIG. 2, a human-machine interface (HMI) is provided to allow a user to control said irradiation parameters (using input or selection means) and/or to monitor their progress (using an image capture means in the chamber displaying the irradiation area and the devices being irradiated).

FIG. 1 shows a schematic view of the automated data erasure device according to various preferred embodiments. In some of these embodiments, the X-ray source includes a Tungsten or Molybdenum target (CX). This type of target proves particularly advantageous for delivering an effective X-ray beam for erasing data in the memories (M) of electronic devices (A) on the market. In addition, the applicant of the present application has observed that among the important parameters for irradiating memories (M) to erase data, the power supply voltage of the source was important, as well as the target intensity of the source. Thus, the selection of a voltage, a target, and a target intensity is necessary to obtain the desired results.

In some embodiments, the X-ray source includes a Beryllium window (F). This type of window has the advantage of filtering out high-energy rays and allowing low-energy rays to pass through. The use of a low-thickness Beryllium window has been shown to be particularly advantageous for obtaining effective irradiation for data erasure. Aluminum windows can also be used with different parameters. Indeed, depending on the materials used for the target and/or window, the voltage and intensity must be adjusted and the target intensity may vary depending on the case. Similarly, depending on the distance between the source (S) and the device to be irradiated, the parameters (especially the intensity) vary, and the skilled person can adjust the parameters to obtain effective irradiation according to the type of configuration chosen, particularly in terms of materials and distance between the target and device thanks to the explanations provided in the present application. For example, in the case of Beryllium windows, some embodiments provide that the control unit (CU) controls the irradiation power by controlling a supply voltage of the X-ray source between 175 (one hundred seventy-five) and 300 (three hundred) kilovolts and a target X-ray source intensity between 250 (two hundred fifty) and 900 (nine hundred) microamperes, preferably 350 (three hundred fifty) to 750 (seven hundred fifty) microamperes. Moreover, the irradiation time strongly depends on the type of memory (M) present in the devices (A) to be irradiated. Thus, the control unit (CU) controls the X-ray source to deliver irradiation for a duration ranging from one to eight minutes, preferably two to five minutes.

In some of these embodiments, the distance between said source (S) and the conveyor transporting the devices is between two and five centimeters, preferably 2.5 to 4 centimeters. Indeed, the applicant has observed that erasure is more effective when the memory to be erased is separated from the source (S) by only 2 to 3 centimeters. However, it is possible to have a greater distance, especially with higher intensities depending on the type of windows used.

In some embodiments, the source (S) generates a beam of X-rays irradiating said devices (A) along a main axis (AF) that is inclined or inclinable (or tiltable) with respect to the conveyor plane. Indeed, the applicant of the present application has observed that irradiation by a non-perpendicular beam to the conveyor plane allowed in some cases to facilitate data erasure, particularly in the case of memories with three-dimensional structures. Moreover, such an inclined beam often allows avoiding damaging other components of the electronic devices (A) whose memory contents are to be erased, or at least limiting the risks of damage. FIG. 2 represents an illustrative and non-limiting example of such embodiments with an inclined main axis (AF) of the X-ray beam. The control unit (CU) is then configured to control the beam inclination, for example under the control of a user using the human-machine interface (HMI) or under the control of parameters pre-recorded in a memory, depending on the identification of the device (A) to be irradiated. It is not necessary to describe here in more detail the control of the inclination of an X-ray beam which is widely known to those skilled in the art. From the present application, it will be understood that the inclination may be at a fixed angle determined based on the preferred angles for most known devices (A) or may be variable and adjusted by the control unit (CU) controlling a motor tilting the source and its beam, for example depending on the identification of successive devices (A) brought into the chamber (1). In some embodiments, the control unit (CU) also controls the inclination of the main axis of the beam according to the type of device present in the chamber (1). Thus, the main axis is tiltable at various angles with respect to the conveyor plane, so that the X-ray beam can optimally target the memories (M) according to their architecture and/or their positioning with respect to the other components of the device (A) containing them. Thus, said source (S) can be mounted on at least one motor configured for the displacement of the source (S) with respect to the conveyor. This displacement can thus be controlled by the control unit (CU) determining a focus on which the X-ray beam should be centered within the targeted device at each instant.

It is understood that the present invention also concerns a reliable and fast method for data erasure, avoiding as much as possible the unnecessary destruction of devices and preferably compatible with the automation of electronic data erasure. Indeed, thanks to the configuration proposed and/or the parameters identified by the applicant of the present application, the invention also provides an effective method of data erasure allowing time savings and better preservation of the materials and components of the devices (A) which are a major source of pollution when destroyed.

The invention therefore relates to a method for erasing data stored in non-volatile memories (M) of electronic devices (A), for example portable devices such as smartphones or tablets, characterized in that it comprises irradiating said electronic devices (A) with at least one source (S) of X-rays confined in a X-ray-tight enclosure (or "enclosure hermetic to X-rays) of an irradiation chamber (1) able to successively receive a plurality of electronic devices (A) which can be brought into the chamber by a conveyor (2), the conveyor (2) and said source (S) of X-rays being controlled by a control unit (CU) controlling the power and duration of irradiation for erasing the data contained in the non-volatile memory (M) of said electronic devices (A). The various embodiments of the device described in the present application also apply to the method which may therefore comprise various steps and use various parameters according to the functionalities described in the present application. For example, the method may comprise an inclination of the ray beam adjusted by the control unit, as a function of the architecture of the device to be irradiated (e.g., the location of the memory with respect to other components).

The present application describes various technical features and advantages with reference to the figures and/or various embodiments. The skilled person will understand that the technical features of a given embodiment may actually be combined with features of another embodiment unless the reverse is explicitly stated or it is evident that these features are incompatible or that the combination does not provide a solution to at least one of the technical problems mentioned in this application. Moreover, the technical features described in a given embodiment may be isolated from the other features of that embodiment unless the reverse is explicitly stated.

DETAILED LIST OF REFERENCES IN THE FIGURES

M: non-volatile memory
A: electronic device
1: chamber
S: X-ray source
2: conveyor
CU: control unit
AF: main axis of the X-ray beam
CX: target of the X-ray source
F: window of the X-ray source
IHM: Human-Machine Interface
What is claimed is:

1. An automated device for erasing data stored in non-volatile memories of electronic devices,
   wherein said automated device comprises:
   an irradiation chamber comprising at least one X-ray source confined in an X-ray- tight enclosure and capable of successively receiving said electronic devices to be brought into the chamber by a conveyor,
   an identification device for recognizing a type of said electronic devices and/or a type of memory of each of said electronic devices to irradiate; and a control unit controlling the conveyor and said X-ray source to irradiate said each of said electronic devices with controlled power and duration as a function of irradiation parameters corresponding to the device identified by said identification device, for erasing data contained in the non-volatile memories of said electronic devices without inducing physical damage or permanent modification of cells in said memories, wherein said X-ray source generates an X-ray beam irradiating said devices along a principal axis that is inclined or inclinable with respect to a plane of said conveyor, and wherein an angle of the principal axis is determined by said control unit according to said identification.

2. The device according to claim 1, wherein the control unit controls the X-ray source by controlling the power and duration based on the type of memory contained in said electronic devices.

3. The device according to claim 1, wherein the control unit controls the irradiation power by controlling a supply voltage of the X-ray source between 175 and 300 kilovolts and a target intensity of the X-ray source between 250 and 900 microamperes.

4. The device according to claim 1, wherein the control unit controls the X-ray source to deliver irradiation for a duration of between 1 and 8 minutes.

5. The device according to claim 1, wherein the X-ray source comprises a target made of tungsten or molybdenum.

6. The device according to claim 1, wherein the X-ray source comprises a window made of beryllium or aluminum.

7. The device according to claim 1, wherein the distance between said X-ray source and the conveyor transporting the devices is between 2 and 5 centimeters.

8. The device according to claim 1, wherein the control unit controls the irradiation power by controlling a supply voltage of the X-ray source between 175 and 300 kilovolts and a target intensity of the X-ray source between 250 and 900 microamperes.

9. The device according to claim 1, wherein said control unit determines, by the identification device, a location and the type of memory of said electronic devices to irradiate and controls, for controlling at least the speed of said conveyor and the power and duration of the irradiation from said X-ray source, according to said location and type.

10. The device according to claim 1, wherein the identification device recognizes said electronic devices based on an identifier of said each of electronic devices.

11. The device according to claim 1, wherein the identification device recognizes said electronic devices based on reference information of an irradiation parameter stored in a memory of said automated device.

12. A method for erasing data stored in non-volatile memories of electronic devices, wherein the method comprises:

an identification of each of said electronic devices for recognizing a type of said electronic devices and/or a type of memory of each of said electronic devices to irradiate, a determination, by a control unit, of irradiation parameters corresponding to said electronic devices identified in said identification, and an irradiation of said electronic devices with at least one X-ray source confined in a X-ray-tight enclosure of an irradiation chamber capable of successively receiving said electronic devices to be brought into the chamber by a conveyor, the conveyor and said X-ray source being controlled by said control unit according to said irradiation parameters including power and duration of irradiation for erasing data contained in the non-volatile memory of said electronic devices without inducing physical damage or permanent modification of cells in said memories, wherein a principal axis of an X-ray beam is generated by said X-ray source, the principal axis being inclined or inclinable with respect to a plane of said conveyor, and the angle of the principal axis being determined per said control unit according to said identification.

13. The method according to claim 12, wherein the control unit controls the X-ray source by controlling the power and duration based on the type of memory contained in said electronic devices.

14. The method according to claim 12, wherein the control unit controls the irradiation power by controlling a supply voltage of the X-ray source between 175 and 300 kilovolts and a target intensity of the X-ray source between 250 and 900 microamperes.

15. The method according to claim 12, wherein the control unit (CU) controls the X-ray source to deliver irradiation for a duration of between 1 and 8 minutes.

16. The method according to claim 12, wherein the control unit controls the X-ray source to deliver irradiation for a duration of between 2 and 5 minutes.

17. The method according to claim 12, wherein said identification is based on an identifier of said each of electronic devices.

18. The method according to claim 12, wherein said identification is based on reference information of an irradiation parameter stored in a memory of said automated device.

* * * * *